(12) United States Patent
Hatta

(10) Patent No.: US 10,464,319 B2
(45) Date of Patent: Nov. 5, 2019

(54) LIQUID-DROPLET EJECTING APPARATUS AND NON-TRANSITORY STORAGE MEDIUM STORING PROGRAM

(71) Applicant: Brother Kogyo Kabushiki Kaisha, Nagoya-shi, Aichi-ken (JP)

(72) Inventor: Fumika Hatta, Kuwana (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 15/940,380

(22) Filed: Mar. 29, 2018

(65) Prior Publication Data
US 2019/0099999 A1 Apr. 4, 2019

(30) Foreign Application Priority Data
Sep. 29, 2017 (JP) .................................. 2017-192096

(51) Int. Cl.
*B41J 2/045* (2006.01)
*B41J 2/145* (2006.01)
*H01L 41/04* (2006.01)

(52) U.S. Cl.
CPC ......... *B41J 2/04548* (2013.01); *B41J 2/0455* (2013.01); *B41J 2/0457* (2013.01); *B41J 2/04506* (2013.01); *B41J 2/04541* (2013.01); *B41J 2/04568* (2013.01); *B41J 2/04581* (2013.01); *B41J 2/145* (2013.01); *H01L 41/042* (2013.01)

(58) Field of Classification Search
CPC combination set(s) only.
See application file for complete search history.

(56) References Cited

U.S. PATENT DOCUMENTS 5,455,895 A * 10/1995 Hattori ................... G06K 15/00
358/1.13
6,290,333 B1 * 9/2001 Wade .................... B41J 2/04506
347/50
(Continued)

FOREIGN PATENT DOCUMENTS

JP 2008-173910 A 7/2008
JP 2009-027787 A 2/2009
(Continued)

*Primary Examiner* — Scott A Richmond
(74) *Attorney, Agent, or Firm* — Banner & Witcoff, Ltd.

(57) ABSTRACT

A liquid-droplet ejecting apparatus includes: N nozzles; N driving elements; M power supply circuits that create a driving signal to be selectively supplied to the N driving elements; and N selecting circuits that selectively connect one of the M power supply circuits to a corresponding one of the N driving elements. The N driving elements are connected to the M power supply circuits in a first combination until a particular condition is satisfied. The first combination is a combination between the M power supply circuits and an M driving element groups, into which the N driving elements are divided based on a voltage of the supplied driving signal. The N driving elements are connected to the M power supply circuits in a second combination after the particular condition is satisfied. The second combination is another combination between the M driving element groups and the M power supply circuits.

12 Claims, 15 Drawing Sheets

| RANK | NUMBER OF NOZZLES |
|------|-------------------|
| R1 | 100 |
| R2 | 300 |
| R3 | 600 |
| R4 | 500 |
| R5 | 180 |

POWER SOURCE ASSIGNMENT AL1

| POWER SOURCE NUMBER | RANK |
|---------------------|------|
| 1 | R1 |
| 2 | R5 |
| 3 | R3 |
| 4 | R2 |
| 5 | R4 |

(56) References Cited

U.S. PATENT DOCUMENTS

| | | | | |
|---|---|---|---|---|
| 6,712,439 B1* | 3/2004 | Anderson | B41J 2/04541 | 347/12 |
| 6,830,305 B1* | 12/2004 | Takizawa | B41J 2/04541 | 347/10 |
| 8,419,147 B2* | 4/2013 | Ide | B41J 2/04548 | 347/10 |
| 9,555,627 B2* | 1/2017 | Sano | B41J 2/04541 | |
| 10,016,974 B2* | 7/2018 | van Brocklin | B41J 2/04573 | |
| 10,040,280 B2* | 8/2018 | Van Brocklin | B41J 2/04508 | |
| 2001/0026292 A1* | 10/2001 | Ishizaki | B41J 2/04541 | 347/12 |
| 2002/0145639 A1* | 10/2002 | Masuda | B41J 2/04541 | 347/14 |
| 2005/0041073 A1* | 2/2005 | Fontaine | B41J 2/0452 | 347/68 |
| 2005/0140707 A1* | 6/2005 | Imanaka | B41J 2/04538 | 347/9 |
| 2005/0231179 A1* | 10/2005 | Ishizaki | B41J 2/04541 | 323/234 |
| 2007/0236521 A1* | 10/2007 | Kondoh | B41J 2/04506 | 347/10 |
| 2007/0296771 A1* | 12/2007 | Ou | B41J 2/04506 | 347/68 |
| 2009/0033306 A1* | 2/2009 | Tanzawa | G11C 5/145 | 323/293 |
| 2010/0052873 A1* | 3/2010 | Hamaya | H03K 7/08 | 340/538 |
| 2010/0097114 A1* | 4/2010 | Miyazaki | H03K 7/08 | 327/176 |
| 2010/0103211 A1* | 4/2010 | Miyazaki | B41J 2/04541 | 347/10 |
| 2011/0090273 A1* | 4/2011 | Miyazaki | B41J 2/04553 | 347/10 |
| 2018/0281387 A1* | 10/2018 | Hatta | B41J 2/04508 | |

FOREIGN PATENT DOCUMENTS

| | | |
|---|---|---|
| JP | 2013-195804 A | 9/2013 |
| JP | 2015-024531 A | 2/2015 |

* cited by examiner

FIG.6
| RANK | NUMBER OF NOZZLES |
|---|---|
| R1 | 100 |
| R2 | 300 |
| R3 | 600 |
| R4 | 500 |
| R5 | 180 |
POWER SOURCE ASSIGNMENT AL1
| POWER SOURCE NUMBER | RANK |
|---|---|
| 1 | R1 |
| 2 | R2 |
| 3 | R3 |
| 4 | R4 |
| 5 | R5 |
POWER SOURCE ASSIGNMENT AL2
| POWER SOURCE NUMBER | RANK |
|---|---|
| 1 | R3 |
| 2 | R2 |
| 3 | R1 |
| 4 | R5 |
| 5 | R4 |
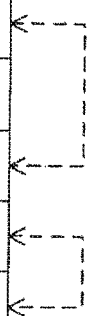

FIG.9

| RANK | NUMBER OF NOZZLES |
|---|---|
| R1 | 100 |
| R2 | 300 |
| R3 | 600 |
| R4 | 500 |
| R5 | 180 |

POWER SOURCE ASSIGNMENT AL12

| POWER SOURCE NUMBER | RANK |
|---|---|
| 1 | R5 |
| 2 | R1 |
| 3 | R2 |
| 4 | R3 |
| 5 | R4 |

POWER SOURCE ASSIGNMENT AL11

| POWER SOURCE NUMBER | RANK |
|---|---|
| 1 | R1 |
| 2 | R2 |
| 3 | R3 |
| 4 | R4 |
| 5 | R5 |

POWER SOURCE ASSIGNMENT AL13

| POWER SOURCE NUMBER | RANK |
|---|---|
| 1 | R4 |
| 2 | R5 |
| 3 | R1 |
| 4 | R2 |
| 5 | R3 |

POWER SOURCE ASSIGNMENT AL15

| POWER SOURCE NUMBER | RANK |
|---|---|
| 1 | R2 |
| 2 | R3 |
| 3 | R4 |
| 4 | R5 |
| 5 | R1 |

POWER SOURCE ASSIGNMENT AL14

| POWER SOURCE NUMBER | RANK |
|---|---|
| 1 | R3 |
| 2 | R4 |
| 3 | R5 |
| 4 | R1 |
| 5 | R2 |

FIG.11
| RANK | TOTAL NUMBER OF EJECTIONS |
|------|---------------------------|
| R1   | 5000                      |
| R2   | 600                       |
| R3   | 3000                      |
| R4   | 200                       |
| R5   | 1000                      |
POWER SOURCE ASSIGNMENT AL21
| POWER SOURCE NUMBER | RANK |
|---------------------|------|
| 1 | R1 |
| 2 | R2 |
| 3 | R3 |
| 4 | R4 |
| 5 | R5 |
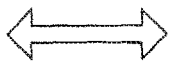
POWER SOURCE ASSIGNMENT AL22
| POWER SOURCE NUMBER | RANK |
|---------------------|------|
| 1 | R4 |
| 2 | R3 |
| 3 | R2 |
| 4 | R1 |
| 5 | R5 |

| RANK | NUMBER OF NOZZLES |
|---|---|
| R1 | 100 |
| R2 | 300 |
| R3 | 600 |
| R4 | 500 |
| R5 | 180 |

POWER SOURCE ASSIGNMENT AL1

| POWER SOURCE NUMBER | RANK |
|---|---|
| 1 | R1 |
| 2 | R5 |
| 3 | R3 |
| 4 | R2 |
| 5 | R4 |

| RANK | NUMBER OF NOZZLES |
|---|---|
| R1 | 100 |
| R2 | 300 |
| R3 | 600 |
| R4 | 500 |
| R5 | 180 |

POWER SOURCE ASSIGNMENT AL1

| POWER SOURCE NUMBER | RANK | |
|---|---|---|
| 1 | R3 | ←----- |
| 2 | R1 | ←----- |
| 3 | R2 | |
| 4 | R4 | |
| 5 | R5 | ←----- |

LIQUID-DROPLET EJECTING APPARATUS AND NON-TRANSITORY STORAGE MEDIUM STORING PROGRAM

The present application claims priority from Japanese Patent Application No. 2017-192096, which has filed on Sep. 29, 2017, the disclosure of which is herein incorporated by reference in its entirety.

BACKGROUND

The present disclosure relates to a liquid-droplet ejecting apparatus and a non-transitory storage medium storing a program readable by a computer of the liquid-droplet ejecting apparatus.

There is known a liquid-droplet ejecting apparatus configured to select one of driving signals of a plurality of types and supply the driving signal to a driving element to reduce variations in amount of liquid to be ejected from nozzles.

In the case where a plurality of power supply circuits are provided to create the driving signals of the plurality of types, there is a demand for prolonging the life of each of the power supply circuits.

SUMMARY

Accordingly, an aspect of the disclosure relates to a liquid-droplet ejecting apparatus and a non-transitory storage medium capable of prolonging a life of each of a plurality of power supply circuits.

In one aspect of the disclosure, a liquid-droplet ejecting apparatus includes: an N number of nozzles; an N number of driving elements provided respectively corresponding to the N number of nozzles; an M number of power supply circuits each configured to create a driving signal to be selectively supplied to a corresponding one of the N number of driving elements; an N number of selecting circuits disposed between the N number of driving elements and the M number of power supply circuits and configured to selectively connect one of the M number of power supply circuits to a corresponding one of the N number of driving elements; and a controller. The controller is configured to perform: controlling the N number of selecting circuits such that the N number of driving elements are connected to the M number of power supply circuits in a first combination until a particular condition is satisfied, the first combination being a combination between an M number of driving element groups and the M number of power supply circuits respectively corresponding to the M number of driving element groups, the N number of driving elements being divided into the M number of driving element groups based on a voltage of the supplied driving signal; and controlling the N number of selecting circuits such that the N number of driving elements are connected to the M number of power supply circuits in a second combination after the particular condition is satisfied, the second combination being a combination between the M number of driving element groups and the M number of power supply circuits respectively corresponding to the M number of driving element groups, the second combination being different from the first combination.

In another aspect of the disclosure, a liquid-droplet ejecting apparatus includes: an N number of nozzles; an N number of driving elements provided respectively corresponding to the N number of nozzles; an M number of power supply circuits each configured to create a driving signal to be selectively supplied to a corresponding one of the N number of driving elements; an N number of selecting circuits disposed between the N number of driving elements and the M number of power supply circuits and configured to selectively connect one of the M number of power supply circuits to a corresponding one of the N number of driving elements; and a controller. The controller is configured to control the N number of selecting circuits such that the N number of driving elements are connected to the M number of power supply circuits in a first combination until a particular condition is satisfied, the first combination being a combination between an M number of driving element groups and the M number of power supply circuits respectively corresponding to the M number of driving element groups, the N number of driving elements being divided into the M number of driving element groups based on a voltage of the supplied driving signal. The M number of driving element groups comprise a first driving element group and a second driving element group different from the first driving element group. The M number of power supply circuits comprise: a first power supply circuit corresponding to the first driving element group in the first combination; and a second power supply circuit corresponding to the second driving element group in the first combination. The number of driving elements in the first driving element group is greater than the number of driving elements in the second driving element group. The first power supply circuit is disposed at a position at which an amount of heat transferred from a heat source disposed in the liquid-droplet ejecting apparatus is less than an amount of heat transferred from the heat source to a position at which the second power supply circuit is disposed.

In yet another aspect of the disclosure, a liquid-droplet ejecting apparatus includes: an N number of nozzles; an N number of driving elements provided respectively corresponding to the N number of nozzles; an M number of power supply circuits each configured to create a driving signal to be selectively supplied to a corresponding one of the N number of driving elements; an N number of selecting circuits disposed between the N number of driving elements and the M number of power supply circuits and configured to selectively connect one of the M number of power supply circuits to a corresponding one of the N number of driving elements; and a controller. The controller is configured to control the N number of selecting circuits such that the N number of driving elements are connected to the M number of power supply circuits in a first combination until a particular condition is satisfied, the first combination being a combination between an M number of driving element groups and the M number of power supply circuits respectively corresponding to the M number of driving element groups, the N number of driving elements being divided into the M number of driving element groups based on a voltage of the supplied driving signal. The M number of driving element groups comprise: a first driving element group; a second driving element group different from the first driving element group; and a third driving element group different from the first driving element group and the second driving element group. The M number of power supply circuits comprise: a first power supply circuit corresponding to the first driving element group in the first combination; a second power supply circuit corresponding to the second driving element group in the first combination; and a third power supply circuit corresponding to the third driving element group in the first combination. The second power supply circuit is disposed at a position which is the closest to the first power supply circuit among the M number of power supply circuits. The third power supply circuit is disposed at a position which is the second closest to the first power supply circuit among the M number of power supply circuits. The number of driving elements in the second driving element group is less than the number of driving elements in the first driving element group. The number of driving elements in the second driving element group is less than the number of driving elements in the third driving element group.

In yet another aspect of the disclosure, a non-transitory storage medium stores a program readable by a computer of a liquid-droplet ejecting apparatus. The liquid-droplet ejecting apparatus includes: an N number of nozzles; an N number of driving elements provided respectively corresponding to the N number of nozzles; an M number of power supply circuits each configured to create a driving signal to be selectively supplied to a corresponding one of the N number of driving elements; and an N number of selecting circuits disposed between the N number of driving elements and the M number of power supply circuits and configured to selectively connect one of the M number of power supply circuits to a corresponding one of the N number of driving elements. When executed by the computer, the program causes the liquid-droplet ejecting apparatus to perform: controlling the N number of selecting circuits such that the N number of driving elements are connected to the M number of power supply circuits in a first combination until a particular condition is satisfied, the first combination being a combination between an M number of driving element groups and the M number of power supply circuits respectively corresponding to the M number of driving element groups, the N number of driving elements being divided into the M number of driving element groups based on a voltage of the supplied driving signal; and controlling the N number of selecting circuits such that the N number of driving elements are connected to the M number of power supply circuits in a second combination after the particular condition is satisfied, the second combination being a combination between the M number of driving element groups and the M number of power supply circuits respectively corresponding to the M number of driving element groups, the second combination being different from the first combination.

BRIEF DESCRIPTION OF THE DRAWINGS

The objects, features, advantages, and technical and industrial significance of the present application of the present disclosure will be better understood by the following detailed description of the embodiment, when considered in connection with the accompanying drawings, in which:

FIG. 6 is a diagram for explaining a first example of operations of the head unit;

FIG. 9 is a diagram for explaining a second example of the operations of the head unit;

FIG. 11 is a diagram for explaining a third example of the operations of the head unit;

DETAILED DESCRIPTION OF THE EMBODIMENT

Figure 1:
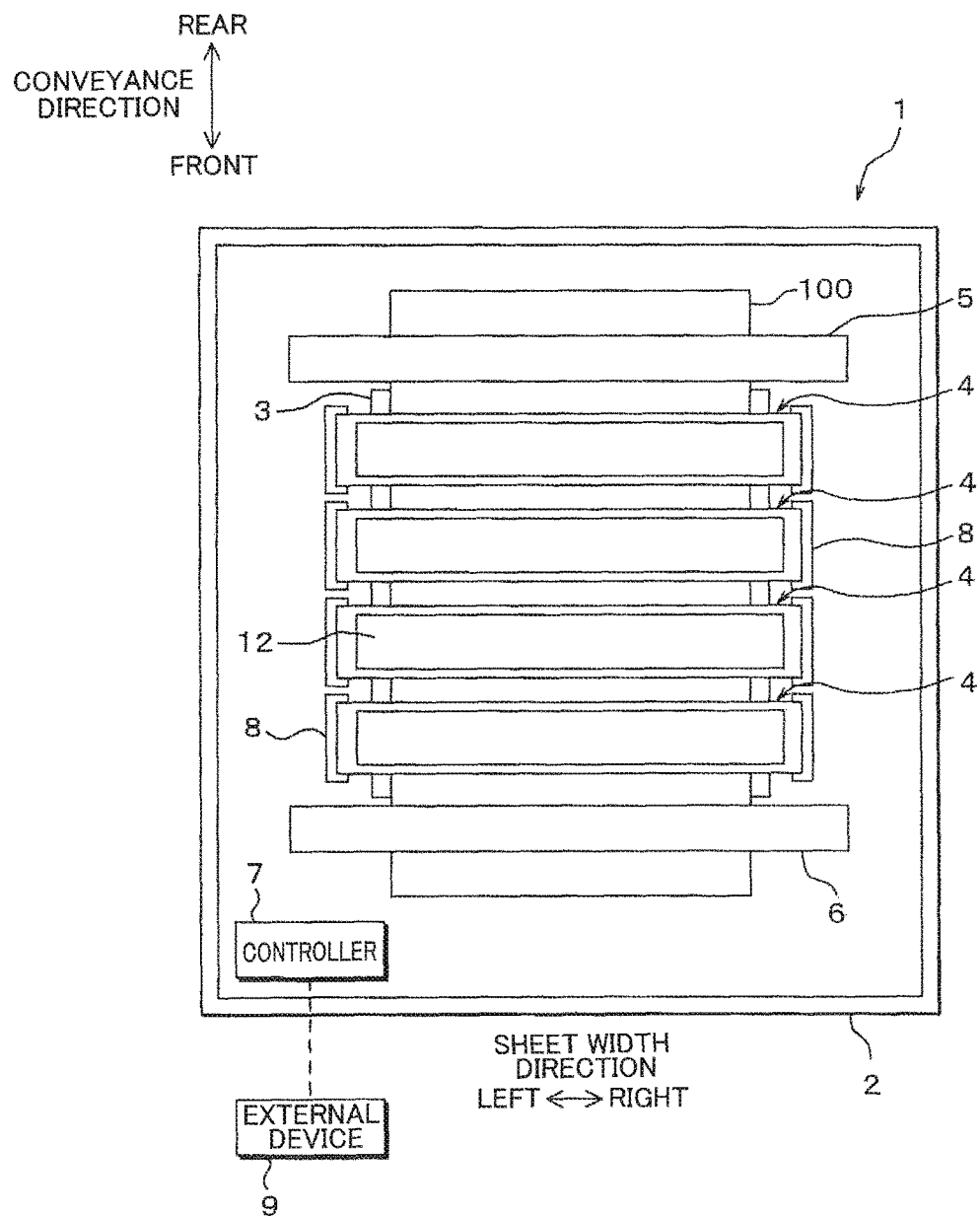
FIG. 1 is a plan view of main components of a printing apparatus according to one embodiment.
Figure 2:
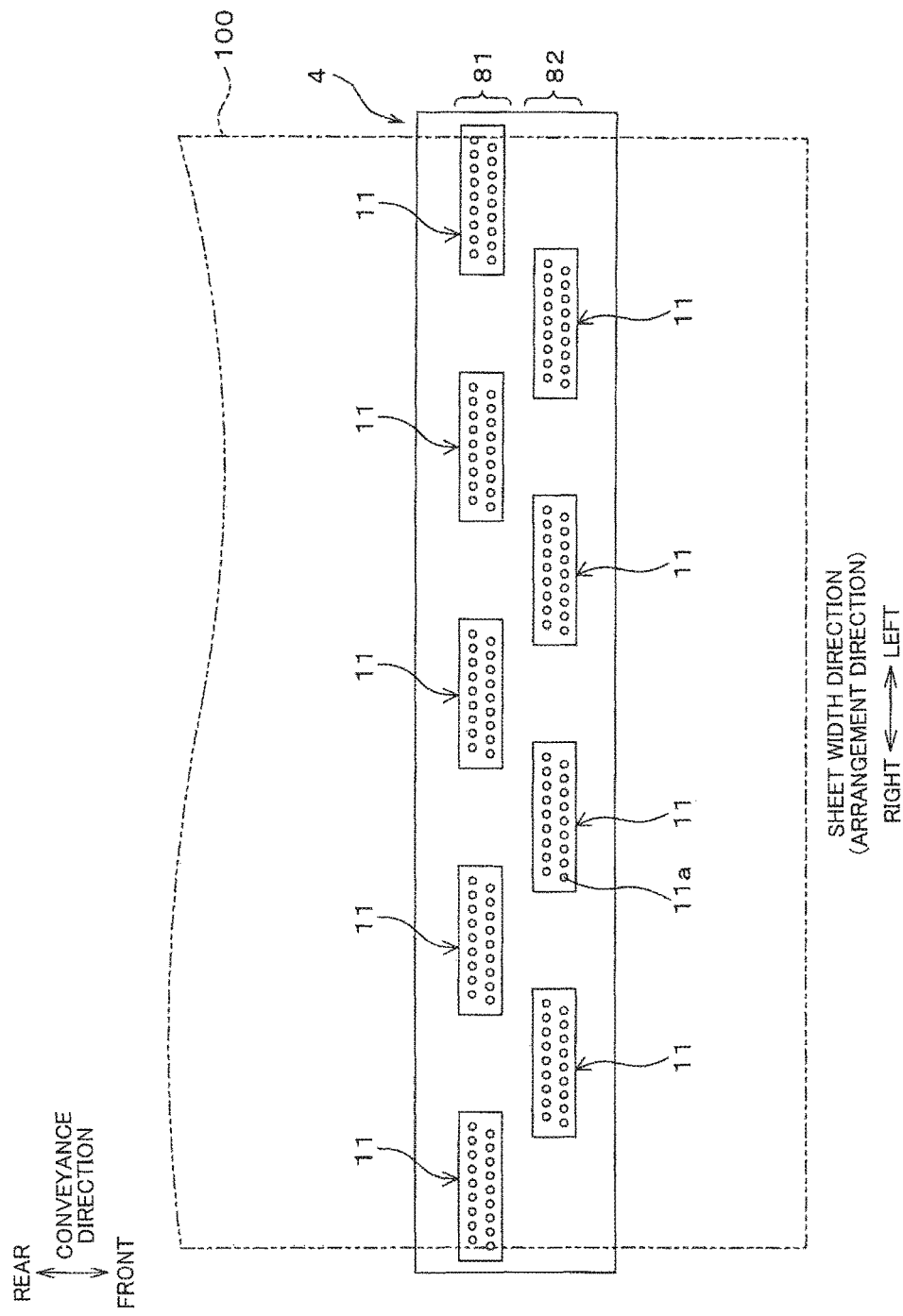
FIG. 2 is a plan view of main components of an ink-jet head, with the ink-jet head viewed from a nozzle-surface side.

Hereinafter, there will be described one embodiment by reference to the drawings. FIG. 1 illustrates a printing apparatus 1 according to the present embodiment. The front and rear direction and the right and left direction are defined as illustrated in FIGS. 1 and 2. The printing apparatus 1, for example, is an ink-jet printer. The printing apparatus 1 includes a housing 2, a platen 3 disposed in the housing 2, four ink-jet heads 4 each as a liquid-droplet ejecting apparatus, two conveyance rollers 5, 6, and a controller 7. It is noted that the number of the ink-jet heads 4 and the conveyance rollers 5, 6 is not limited to that in the example in FIG. 1.

A recording sheet 100 used in the printing apparatus 1 is placed on the platen 3. The conveyance rollers 5, 6 are respectively arranged in opposite end portions of the platen 3 in the front and rear direction. Rotation of the conveyance rollers 5, 6 conveys the recording sheet 100 in the front and rear direction (a conveyance direction).

Each of the ink-jet heads 4 has a rectangular outer shape in plan view and is disposed so as to face the platen 3 such that the short sides of the rectangular shape extend in the conveyance direction (i.e., the front and rear direction) in which the recording sheet 100 is conveyed, and the long sides of the rectangular shape extend in a direction (i.e., the right and left direction) orthogonal to the conveyance direction. The ink-jet heads 4 arranged between the two rollers 5, 6 such that one of long-side surfaces of each of the ink-jet heads 4 is opposed to one of long-side surfaces of a corresponding adjacent one of the ink-jet heads 4 at an appropriate distance.

A plurality of head holders 8 are secured to the housing 2. The head holders 8 are provided above the platen 3 and between the conveyance rollers 5, 6 so as to be arranged in line in the front and rear direction. The ink-jet heads 4 are respectively held by the head holders 8.

The four ink-jet heads 4, for example, correspond to cyan, magenta, yellow, and black, respectively.

The controller 7 includes a first circuit board 71 described below. The first circuit board 71 includes a field-programmable gate array (FPGA) 711, a read-only memory (ROM), not illustrated, a random-access memory (RAM), not illustrated, and an electrically erasable programmable ROM (EEPROM) 712. The controller 7 is capable of communicating with an external device 9 such as a personal computer. When instructed from the external device 9 or an operation device, not illustrated, of the printing apparatus 1, the controller 7 controls operations of the ink-jet heads 4 and the conveyance rollers 5, 6 according to programs stored in the ROM. A central processing unit (CPU) or a microprocessor unit (MPU) may be used instead of the FPGA 711.

The controller 7 controls a motor, not illustrated, to control the conveyance rollers 5, 6 to convey the recording sheet 100. When a printing instruction is input to the external device 9 by a user, the controller 7 transmits a signal of the printing instruction, image data representing an image to be printed, and a signal for controlling a second circuit board 50 described below, so that ink is ejected from head units 11 of the ink-jet heads 4 onto the recording sheet 100 during conveyance of the recording sheet 100.

As illustrated in FIG. 2, each of the ink-jet heads 4 includes the head units 11 each as a liquid-droplet ejecting apparatus. The head units 11 are arranged in two rows that are arranged in the front and rear direction. Four of the head units 11 are arranged in the right and left direction in a front row 82. The other five head units 11 are arranged in the right and left direction in a rear row 81. It is noted that, since the head units 11 have the same configuration, the following description will be provided for one of the head units 11 for simplicity unless otherwise required, and likewise the following description will be provided for one of the ink-jet heads 4 for simplicity unless otherwise required. A nozzle surface of the head unit 11 (a lower surface of a nozzle plate) has ejection openings 11*a* of a multiplicity of nozzles. The head units 11 is provided with driving elements 111 (described below). The number of the driving elements 111 is equal to that of the ejection openings 11*a*. It is noted that the ejection openings 11*a* of the nozzles are schematically illustrated for easy understanding, and the arrangement and the number of the ejection openings 11*a* in the drawings are different from those of the ejection openings 11*a* in reality. While the ink-jet head 4 includes the nine head units 11 in the example in FIG. 2, the number of the head units 11 is not limited to nine. Each of the head units 11 includes the second circuit board 50 and a flexible circuit board 60 described below.

Figure 3:
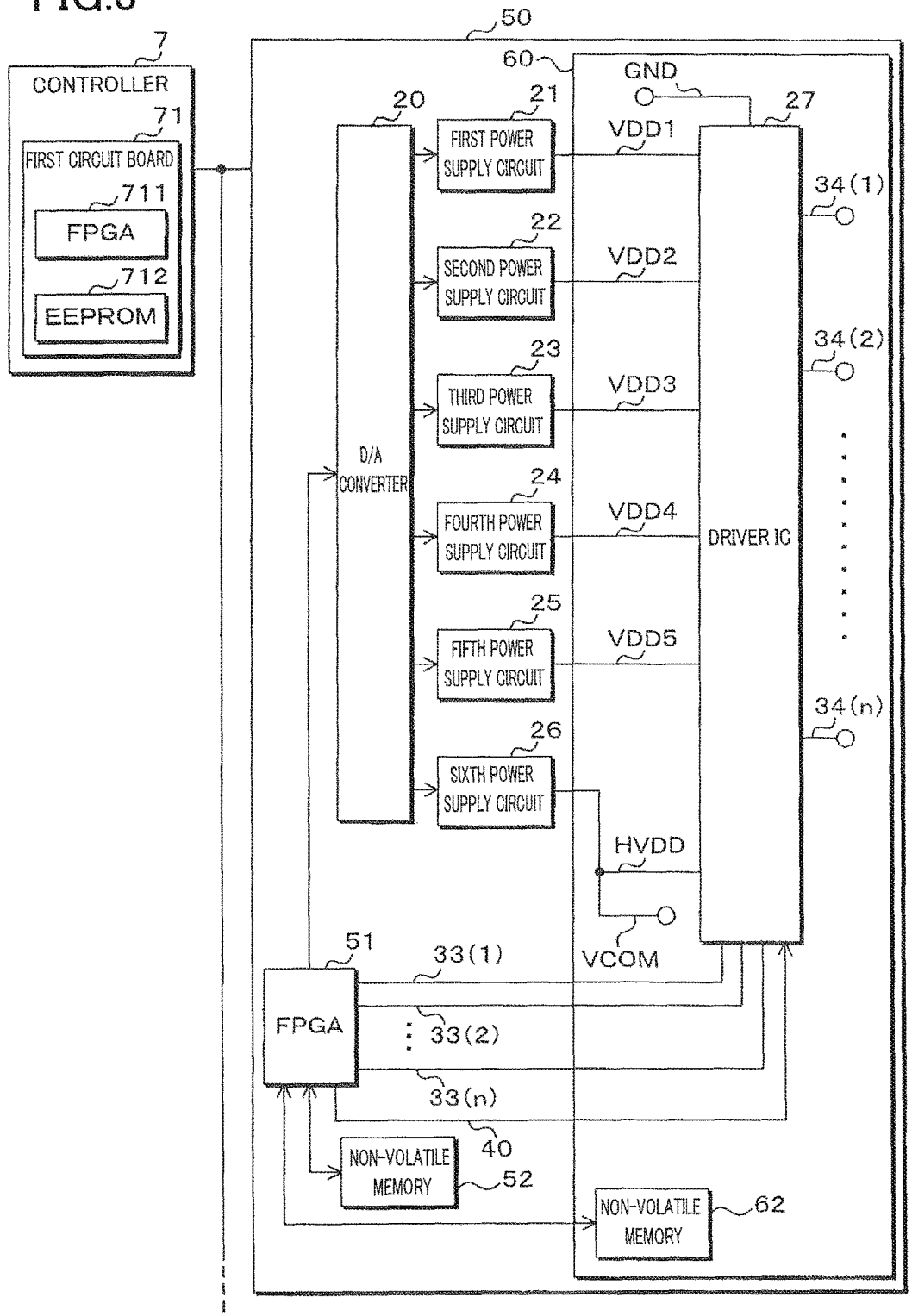
FIG. 3 is a block diagram of configurations of (i) a second circuit board of a head unit and (ii) a flexible circuit board connected to the second circuit board.

As illustrated in FIG. 3, one of the second circuit boards 50 and one of the flexible circuit boards 60 are provided for a corresponding one of the head units 11. For example, in the case where the printing apparatus 1 includes the four ink-jet heads 4, and each of the ink-jet heads 4 includes the nine head units 11, the printing apparatus 1 includes 36 head units 11. Thus, in this case, the number of the second circuit boards 50 is 36, and the number of the flexible circuit boards 60 connected to the respective second circuit boards 50 is 36. The first circuit board 71 is connected to the 36 second circuit boards 50. FIG. 3 illustrates one second circuit board 50 and one flexible circuit board 60 for easy understanding.

Each of the second circuit boards 50 includes an FPGA 51 as a controller, a non-volatile memory 52 such as an EEPROM, a D/A converter 20, a first power supply circuit 21, a second power supply circuit 22, a third power supply circuit 23, a fourth power supply circuit 24, a fifth power supply circuit 25, and a sixth power supply circuit 26. The flexible circuit board 60 includes a driver IC 27 and a non-volatile memory 62 such as an EEPROM.

The FPGA 51 outputs a setting signal under control of the FPGA 711 of the first circuit board 71 via the D/A converter 20. The setting signal is an analog signal for setting an output voltage of each of the first to sixth power supply circuits 21-26.

The D/A converter 20 converts a digital setting signal output from the FPGA 51, to an analog setting signal and outputs the analog setting signal to each of the first to sixth power supply circuits 21-26.

Each of the first to sixth power supply circuits 21-26, for example, may be a DC/DC converter constituted by a plurality of electronic components, such as a field-effect transistor (FET), an inductor, a resistance, and an electrolytic capacitor. Each of the power supply circuits 21-26 outputs an output voltage indicated by the setting signal, to the driver IC 27.

The driver IC 27 is connected to the first power supply circuit 21 through a wire VDD1, to the second power supply circuit 22 through a wire VDD2, to the third power supply circuit 23 through a wire VDD3, to the fourth power supply circuit 24 through a wire VDD4, to the fifth power supply circuit 25 through a wire VDD5, and to the sixth power supply circuit 26 through a wire HVDD. It is noted that the sixth power supply circuit 26 is connected to a driving element 111, described below, through a wire VCOM. The wire HVDD and the wire VCOM are wires, into which a wire drawn from the sixth power supply circuit 26 is branched at a middle of a route.

The first to sixth power supply circuits 21-26 are connected to waveform generating circuits 30(1)-30(n) formed in the driver IC 27, where n is a natural number of greater than or equal to 2, for example, n is equal to the number of the driving elements 111 of the head unit 11.

The waveform generating circuits 30(1)-30(n) are provided respectively corresponding to the n number of the driving elements 111 (the n driving elements 111) of the head unit 11 which are provided corresponding to the respective nozzles. The driver IC 27 is connected to an n number of signal lines (n signal lines) 34(1)-34(n). The driver IC 27 is connected to the n number of the driving elements 111 through the respective the n number of the signal lines 34(1)-34(n). Each of the signal lines 34 is connected to a corresponding one of individual electrodes of the respective driving elements 111.

The driver IC 27 includes an n number of selectors (n selectors) 90(1)-90(n) respectively corresponding to the n number of the driving elements 111. Each of the selectors 90 is a hardware component including a plurality of FETs formed in the driver IC 27.

The sixth power supply circuit 26 may be used as a VCOM power supply voltage of each of the driving elements 111 or as a high-side back-gate voltage (HVDD) of each of P-type metal oxide semiconductor (PMOS) transistors 311-315 described below.

The non-volatile memory 62 stores nozzle addresses respectively identifying the nozzles constituting each rank described below. The non-volatile memory 52 stores information such as power-source assignment information indicating a power supply circuit corresponding to each rank and the number of ejections of a liquid droplet from the nozzles in each rank.

The driver IC 27 is connected to the FPGA 51 through an n number of control lines (n control lines) 33(1)-33(n) and a control line 40. The control lines 33(1)-33(n) are provided respectively corresponding to the n number of the waveform generating circuits 30(1)-30(n). A signal for controlling an FET of each of the waveform generating circuits 30 is transmitted to a corresponding one of the control lines 33. According to this signal, the waveform generating circuit 30 creates a driving signal for driving the driving element 111 and outputs the created driving signal to the driving element 111 through the signal line 34.

Control signals for controlling the n number of the selectors 90(1)-90(n) of the driver IC 27 are transmitted to the control line 40. The FPGA 51 controls the n number of the selectors 90(1)-90(n) to select a power supply circuit for generating a driving signal to be output to each of the signal lines 34.

Figure 4:
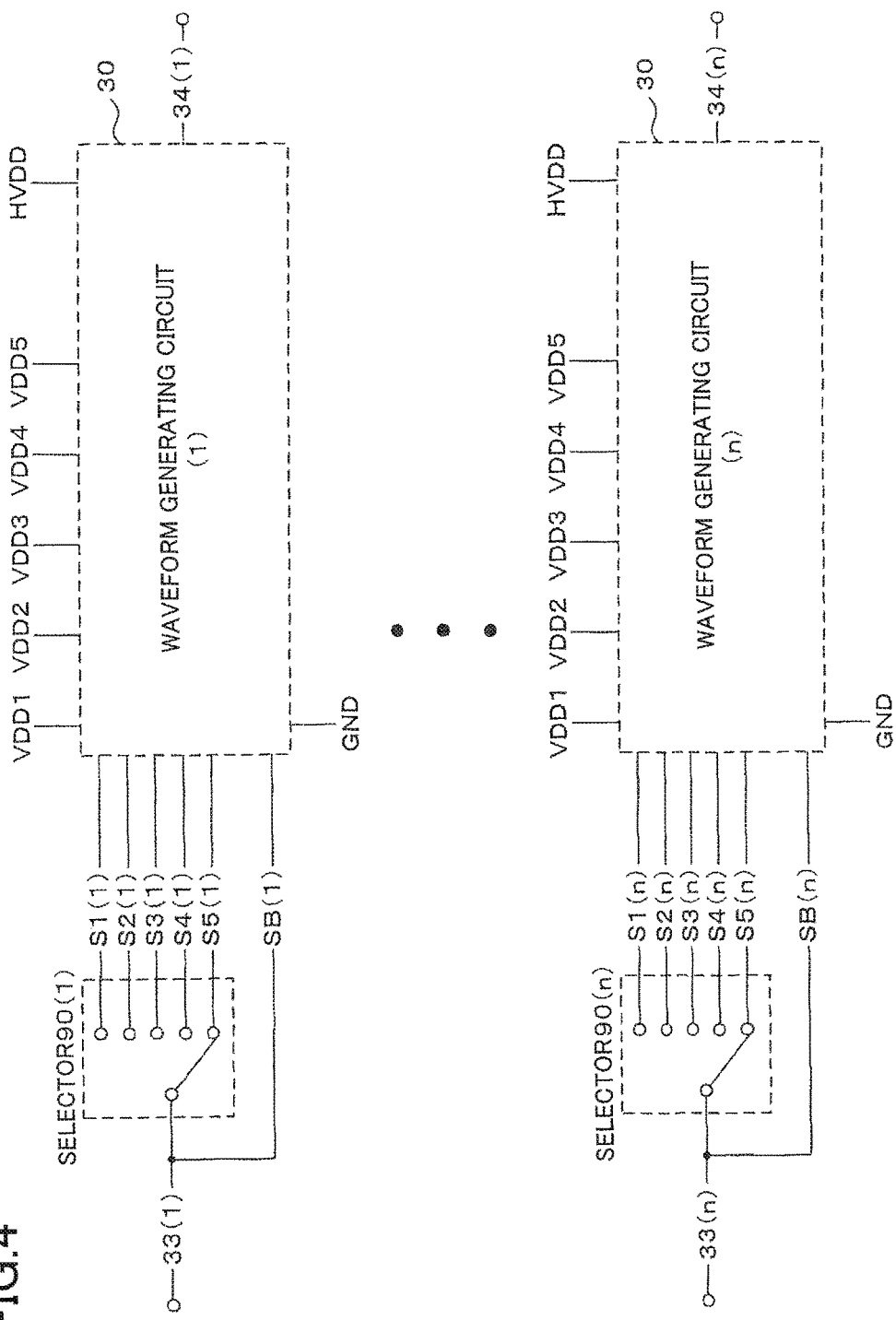
FIG. 4 is a view of a circuit configuration of a driver integrated circuit (IC)

As illustrated in FIG. 4, the driver IC 27 includes n waveform generating circuits 30(1)-30(n), and n selectors 90(1)-90(n) respectively corresponding to the waveform generating circuits 30(1)-30(n).

The driver IC 27 has the n number of configurations (n configurations) identical to each other, and the number of these configurations is equal to that of the nozzles. Thus, there will be described a configuration of a circuit provided between the control line 33(1) and the signal line 34(1) by way of example. In the driver IC 27, the selector 90(1) and the waveform generating circuit 30(1) are formed between the control line 33(1) and the signal line 34(1).

The control line 33(1) extending from the FPGA 51 is connected to the selector 90(1). The control line 33(1) is branched in the middle of the route connecting the FPGA 51 and the selector 90(1). A control line SB(1) that branches off from the middle from the control line 33(1) is connected to the waveform generating circuit 30(1).

The selector 90(1) and the waveform generating circuit 30(1) are connected by five control lines S1(1), S2(1), S3(1), S4(1), S5(1). The selector 90(1) connects a selected one of the five control lines S1(1), S2(1), S3(1), S4(1), S5(1) to the control line 33(1) according to an instruction from the FPGA 51.

The five wires connected to the wires VDD1 to VDD5, the wire connected to the wire HVDD, and the wire connected to a wire GND are connected to the waveform generating circuit 30(1).

Figure 5:
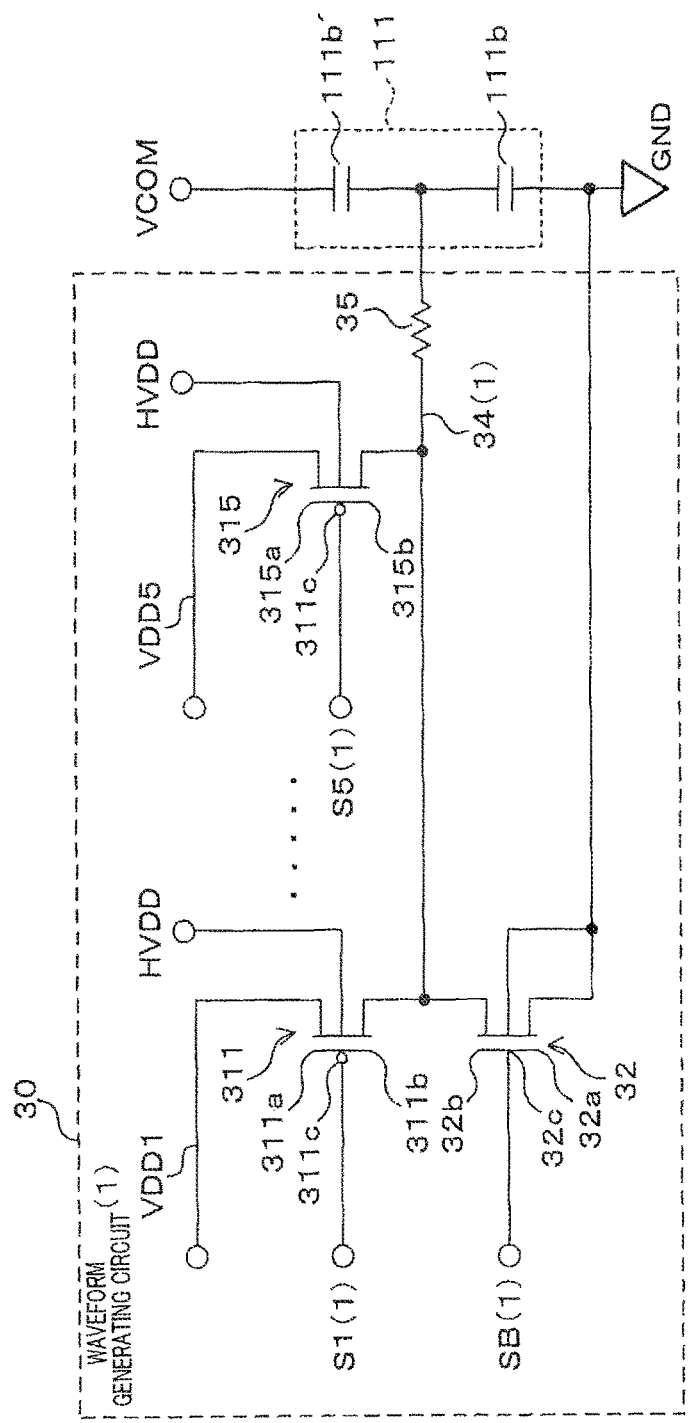
FIG. 5 is a circuit diagram of a configuration of a waveform generating circuit of the head unit.

FIG. 5 illustrates the waveform generating circuit 30(1). Since the waveform generating circuits 30(1)-30(n) have the same configuration, the following description will be provided for only the waveform generating circuit 30(1) unless otherwise required. The waveform generating circuit 30(1) includes the five PMOS transistors 311-315 (noted that FIG. 5 illustrates only two of the transistors), one N-type metal oxide semiconductor (NMOS) transistor 32, and a resistance 35. The waveform generating circuit 30(1) is connected to the individual electrode of the driving element 111 through the signal line 34(1).

In the present embodiment, the driving element 111 is a piezoelectric element including: a first activation portion interposed between the individual electrode and a first constant-potential electrode; and a second activation portion between the individual electrode and a second constant-potential electrode, for one pressure chamber, as disclosed in FIG. 5 of JP-A-2015-24531 (Japanese Patent Application No. 2013-154357). Thus, the driving element 111 includes a capacitor 111b and a capacitor 111b'.

Five source terminals 311a-315a of the five PMOS transistors 311-315 are connected to the signal line 34(1). A source terminal 32a of the NMOS transistor 32 is connected to the ground.

The control line S1(1) is connected to a gate terminal 311c of the PMOS transistor 311. The control line S2(1) is connected to a gate terminal 312c of the PMOS transistor 312. The control line S3(1) is connected to a gate terminal 313c of the PMOS transistor 313. The control line S4(1) is connected to a gate terminal 314c of the PMOS transistor 314. The control line S5(1) is connected to a gate terminal 315c of the PMOS transistor 315. The control line SB(1) is connected to a gate terminal 32c of the NMOS transistor 32.

The PMOS transistor 311 is connected to the first power supply circuit 21 through the wire VDD1. The PMOS transistor 312 is connected to the second power supply circuit 22 through the wire VDD2. The PMOS transistor 313 is connected to the third power supply circuit 23 through the wire VDD3. The PMOS transistor 314 is connected to the fourth power supply circuit 24 through the wire VDD4. The PMOS transistor 315 is connected to the fifth power supply circuit 25 through the wire VDD5.

Drain terminals 311b-315b of the five PMOS transistors 311-315 are connected to one end of the resistance 35. A drain terminal 32b of the NMOS transistor 32 is connected to the one end of the resistance 35. The other end of the resistance 35 is connected to the individual electrode of the driving element 111 (the other end of the capacitor 111b' and one end of the capacitor 111b). The first constant-potential electrode of the driving element 111 (one end of the capacitor 111b') is connected to the VCOM, and the second constant-potential electrode of the driving element 111 (the other end of the capacitor 111b) is connected to the ground.

When the FPGA 51 outputs a signal of a low level (L) to the control line 33(1), one of the PMOS transistors 311-315 which is connected to the signal line selected by the selector 90(1) as described above becomes an ON state. The capacitor 111b is charged by a voltage supplied from one of the power supply circuits 21-25, and the capacitor 111b' is discharged. When the FPGA 51 outputs a signal of a high level (H) to the control line 33(1), the NMOS transistor 32 becomes an ON state, the capacitor 111b' is charged by a voltage output from one of the power supply circuits 21-25, and the capacitor 111b is discharged. The capacitors 111b and 111b' alternately perform charging and discharging, whereby the driving element 111 is deformed to eject the ink from the ejection opening 11a of the nozzle.

That is, a driving signal for driving the driving element 111 is output to the signal line 34(1). The selector 90(1) selects a control line to be connected, from among the five control lines S1(1)-S5(1), making it possible to select a power supply circuit for generating a driving signal from among the five power supply circuits 21-25.

There will be next described operations of the head unit 11 in the present embodiment.

FIG. 6 is for explaining a first example of the operations of the head unit 11 in the present embodiment. In the case where a predetermined voltage is applied to the individual electrode of each of the driving elements 111, the velocity or an amount of a droplet of the liquid (the ink) ejected from the ejection opening 11a of the nozzle varies among the nozzles (noted that the velocity and the amount may be hereinafter referred to as "liquid-droplet ejection velocity" and "liquid-droplet ejection amount", respectively). Thus, the ejection openings 11a are divided into a plurality of ranks based on the liquid-droplet ejection velocity or the liquid-droplet ejection amount. Also, the nozzle addresses identifying the respective nozzles belonging to each rank (group) are set in advance. The non-volatile memory 62 in advance stores a table that defines a relationship between each rank and the nozzle addresses identifying the respective nozzles corresponding to each rank. In the case where the number of nozzles is 1680, the nozzle addresses may be set to 1 to 1680.

As illustrated in FIG. 6, the 1680 nozzles are divided into five ranks R1-R5 according to the table described above. In the present embodiment, when the driving elements 111 of all the ranks are driven by the driving signal at the same voltage, the rank R1 is the highest in the liquid-droplet ejection velocity and the largest in the liquid-droplet ejection amount among the ranks R1-R5, with the ranks R2, R3, R4, and R5 following in this order. The ranks R1-R5 are respectively constituted by 100 nozzles, 300 nozzles, 600 nozzles, 500 nozzles, and 180 nozzles. It is noted that the number of ranks is not limited to five.

The power source numbers 1-5 in FIG. 6 respectively correspond to the first to fifth power supply circuits 21-25. The first to fifth power supply circuits 21-25 are respectively represented by the power source numbers 1-5 for convenience. At first, i.e., until a particular condition is satisfied, the power source numbers 1-5 are assigned to the respective ranks R1-R5 according to a power source assignment ALI.

That is, the FPGA 51 controls an N number of selectors 90(1)-90(n) (N selectors 90(1)-90(n)) in the driver IC 27 until the particular condition is satisfied, such that an N number of the driving elements 111 (N driving elements 111) are connected to an M number of the power supply circuits 21-25 (M power supply circuits 21-25) according to the power source assignment AL1 (as one example of a first combination), where N and M are 1680 and 5, respectively, for example. The power source assignment AL1 is a combination between an M number of the driving element groups (e.g., the ranks R1-R5) and the M number of the power supply circuits 21-25 (the power source numbers 1-5) respectively corresponding to the M number of the driving element groups.

When the particular condition is satisfied, the power source numbers 1-5 are respectively assigned to the ranks R3, R2, R1, R5, and R4 according to a power source assignment AL2.

That is, the FPGA 51 controls an N number of the selectors 90(1)-90(n) in the driver IC 27 after the particular condition is satisfied, such that the N number of the driving elements 111 are connected to the M number of the power supply circuits 21-25 according to the power source assignment AL2 (as one example of a second combination) different from the first combination. The power source assignment AL2 is a combination between the M number of the driving element groups (e.g., the ranks R1-R5) and the M number of the power supply circuits 21-25 respectively corresponding to the M number of the driving element groups.

In the power source assignment AL1 in the example in FIG. 6, the rank R1 corresponds to the power source number 1, and the rank R3 corresponds to the power source number 3. In the power source assignment AL2, in contrast, the rank R1 corresponds to the power source number 3, and the rank R3 corresponds to the power source number 1. In the power source assignment AL1 the rank R4 corresponds to the power source number 4, and the rank R5 corresponds to the power source number 5. In the power source assignment AL2, in contrast, the rank R4 corresponds to the power source number 5, and the rank R5 corresponds to the power source number 4.

For example, the particular condition is satisfied when a power source is turned on, when a particular length of time, e.g., one day, has passed from the last time when the particular condition is satisfied, or when a print job is ended.

With the configuration described above, when the particular condition is satisfied, the ranks are switched to change the number of nozzles for each of the first to fifth power supply circuits 21-25 which supplies the driving signal to the nozzles. This makes it possible to: prevent the life of a specific power supply circuit from decreasing due to increase in load current on the specific power supply circuit; substantially equalize load currents respectively on all the power supply circuits; and prolong the lives of the power supply circuits.

In the power source assignment AL1 the plurality of driving elements belonging to the rank R3 (as one example of a first driving element group) correspond to the power source number 3 (as one example of a first power supply circuit), and the plurality of driving elements belonging to the rank R1 (as one example of a second driving element group) correspond to the power source number 1 (as one example of a second power supply circuit). In the power source assignment AL2 established after the particular condition is satisfied, the plurality of driving elements belonging to the rank R3 (as one example of the first driving element group) correspond to the power source number 1 (as one example of the second power supply circuit), and the plurality of driving elements belonging to the rank R1 (as one example of the second driving element group) correspond to the power source number 3 (as one example of the first power supply circuit).

In the power source assignment AL1 the plurality of driving elements belonging to the rank R4 (as one example of the first driving element group) correspond to the power source number 4 (as one example of the first power supply circuit), and the plurality of driving elements belonging to the rank R5 (as one example of the second driving element group) correspond to the power source number 5 (as one example of the second power supply circuit). In the power source assignment AL2 established after the particular condition is satisfied, the plurality of driving elements belonging to the rank R4 (as one example of the first driving element group) correspond to the power source number 5 (as one example of the second power supply circuit), and the plurality of driving elements belonging to the rank R5 (as one example of the second driving element group) correspond to the power source number 4 (as one example of the first power supply circuit).

Thus, since the power supply circuits corresponding to the ranks are switched, it is possible to: prevent a load from being concentrated on a specific power supply circuit; substantially equalize load currents respectively on all the power supply circuits; and prolong the lives of the power supply circuits.

The number of nozzles (the number of driving elements) constituting the rank R4 is 500 that is greater than 180 as the number of nozzles constituting the rank R5. Switching the power supply circuits corresponding to the ranks can change the number of driving elements driven by each of the power supply circuits, making it possible to substantially equalize loads on the respective power supply circuits.

In the example in FIG. 6, the rank R3 (as one example of the first driving element group) is the largest in the number of nozzles (600) among the ranks R1-R5. This configuration substantially equalizes loads on the respective power supply circuits by reducing a load on the power supply circuit on which the highest load is imposed.

In the example in FIG. 6, the rank R1 (as one example of the second driving element group) is the smallest in the number of nozzles (100) among the ranks R1-R5. This configuration substantially equalizes loads on the respective power supply circuits by increasing a load on the power supply circuit on which the lowest load is imposed.

Figure 7:
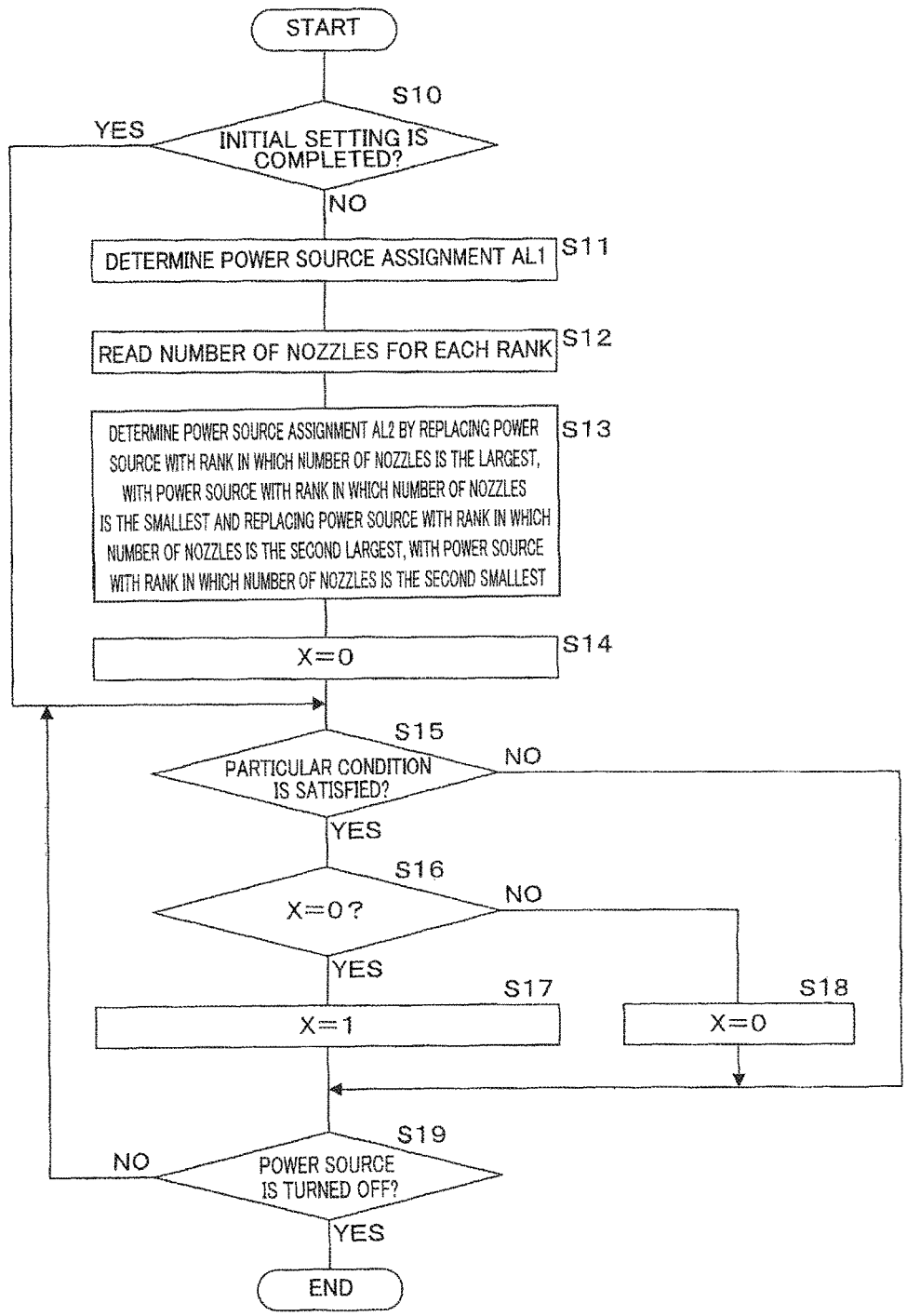
FIG. 7 is a flowchart illustrating a first example of a procedure of processing executed by a field-programmable gate array (FPGA)

FIG. 7 is a flowchart illustrating a first example of a procedure of processing executed by the FPGA 51 in the present embodiment. It is noted that the processing in FIG. 7 corresponds to the operations in FIG. 6. In the description in the present embodiment, a combination between the power supply circuits and the groups of the driving elements respectively corresponding to the power sources will be referred to as "power source assignment AL". In the case where there is a need to distinguish between different combinations, a suffix in the form of a number is added to "AL". Also, "ALD" is added to the power-source assignment information indicating each of the power source assignments AL and readable by a computer. In the case where there is a need to distinguish between the power-source assignment information indicating a certain combination and the power-source assignment information indicating another combination, a suffix in the form of a number is added to "ALD". That is, the power-source assignment information corresponding to the power source assignment AL1 is the power-source assignment information ALD1.

When the printing apparatus 1 is tuned on, the FPGA 51 at S10 determines whether initial setting is completed. This determination is executed by determining whether the power-source assignment information ALD has been stored in the non-volatile memory 52. Specifically, when the power-source assignment information ALD1 and the power-source assignment information ALD2 are stored in the non-volatile memory 52, the FPGA 51 determines that the initial setting is completed (S10: YES), and this procedure goes to S15.

When the power-source assignment information ALD1 and the power-source assignment information ALD2 are not stored in the non-volatile memory 52, the FPGA 51 determines that the initial setting is not completed (S10: NO) and at S11 determines the power source assignment ALE How to determine the power source assignment AL1 is not limited in particular. For example, the printing apparatus 1 may be configured such that the non-volatile memory 52 stores, in advance, a rule for determining how to set the power source assignment AL1 as the power source assignment in the initial setting, and the power source assignment AL1 in the initial setting is determined according to the rule. In the present embodiment, for example, the rule is simply defined such that the smallest number identifying the rank is assigned to the smallest number identifying the power supply circuit, and a larger number identifying the rank is assigned to a larger number identifying the power supply circuit in order, in other words, each of the numbers identifying the respective ranks is assigned to a corresponding one of the numbers identifying the respective power supply circuits in the ascending order of the numbers. The FPGA 51 determines the power source assignment AL1 and stores, into the non-volatile memory 52, the power-source assignment information ALD1 indicating the power source assignment AL1.

The FPGA 51 at S12 reads the number of nozzles corresponding to each rank from the non-volatile memory 62 mounted on the flexible circuit board 60.

The FPGA 51 at S13 determines the power source assignment AL2 by replacing the power source (the power supply circuit) with a rank in which the number of nozzles is the largest in the power source assignment AL1 with the power source with a rank in which the number of nozzles is the smallest in the power source assignment AL1 and replacing the power source with a rank in which the number of nozzles is the second largest in the power source assignment AL1 with the power source with a rank in which the number of nozzles is the second smallest in the power source assignment ALE After the determination of the power source assignment AL2, the FPGA 51 stores, into the non-volatile memory 52, the power-source assignment information ALD2 indicating the power source assignment AL2.

The FPGA 51 at S14 stores a variable X into the non-volatile memory 52 as zero. It is noted that the variable X is information indicating which power source assignment AL (AL1 or AL2) is used to drive the driving elements 111 when the printing apparatus 1 executes the printing processing.

The FPGA 51 at S15 determines whether the particular condition is satisfied. When the particular condition is not satisfied (S15: NO), this procedure goes to S19. When the particular condition is satisfied (S15: YES), the FPGA 51 at S16 determines whether the variable X is zero.

For example, the particular condition is satisfied when the power source is turned on, when a particular length of time, e.g., one day, has passed from the last time when the particular condition is satisfied, or when a print job is ended. For example, the FPGA 51 may acquire (i) a power ON signal indicating the ON state of the power source and (ii) an end signal indicating the end of the print job. The FPGA 51 may include a timer and count a particular length of time from the last time when the particular condition is satisfied.

When the variable X is zero (S16: YES), the FPGA 51 at S17 sets the variable X to one and stores the variable X into the non-volatile memory 52, and at S19 determines whether the power source is turned off by the user. When the power source is turned off (S19: YES), this procedure ends. When the variable X is not zero (S16: NO), the FPGA 51 at S18 sets the variable X to zero and stores the variable X into the non-volatile memory 52, and this procedure goes to S19. When the power source is not turned off (S19: NO), this procedure returns to S15.

The processing from S10 to S14 may be executed in the initial setting as described above.

Figure 8:
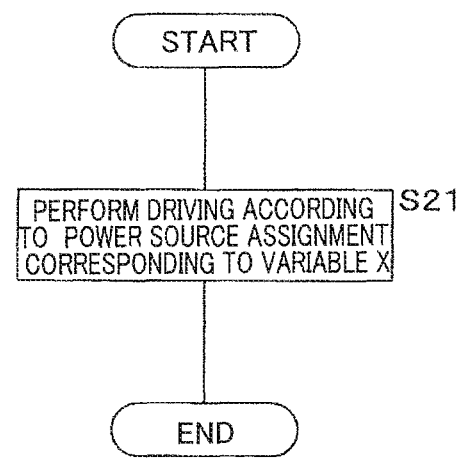
FIG. 8 is a flowchart illustrating a first example of a procedure of printing processing executed by the FPGA.

FIG. 8 is a flowchart illustrating a first example of a procedure of the printing processing executed by the FPGA 51 in the present embodiment. FIG. 8 illustrates processing executed by the FPGA 51 when the printing apparatus 1 receives an instruction for printing from the user in the case where the power source of the printing apparatus 1 is ON. As illustrated in FIG. 8, after the printing apparatus 1 receives the printing instruction, the FPGA 51 at S21 executes printing by driving the driving elements 111 according to the power source assignment AL corresponding to the value indicated by the variable X stored in the processing in FIG. 7. In the present embodiment, in the case where the variable X is zero, the FPGA 51 drives the driving elements 111 according to the power source assignment AL1 based on the power-source assignment information ALD1 stored in the non-volatile memory 52. In the case where the variable X is one, the FPGA 51 drives the driving elements 111 according to the power source assignment AL2 based on the power-source assignment information ALD2 stored in the non-volatile memory 52.

FIG. 9 is for explaining a second example of the operations of the head unit 11 in the present embodiment. The number of nozzles constituting each of the ranks R1-R5 is identical to that of the example in FIG. 6. In FIG. 9, the power source numbers 1-5 respectively correspond to the first to fifth power supply circuits 21-25. As illustrated in FIG. 9, in a power source assignment AL11, the power source numbers 1-5 respectively correspond to the ranks R1-R5. In a power source assignment AL12, the power source numbers 2 to 5, and 1 respectively correspond to the ranks R1-R5. In a power source assignment AL13, the power source numbers 3 to 5, 1, and 2 respectively correspond to the ranks R1-R5. In a power source assignment AL14, the power source numbers 4, 5, 1, 2, and 3 respectively correspond to the ranks R1-R5. In a power source assignment AL15, the power source numbers 5 and 1 to 4 respectively correspond to the ranks R1-R5.

That is, each time when the particular condition is satisfied, the FPGA 51 switches the power supply circuits respectively corresponding to the ranks R1-R5 in rotation, thereby substantially equalizing loads on the respective power supply circuits.

Figure 10:
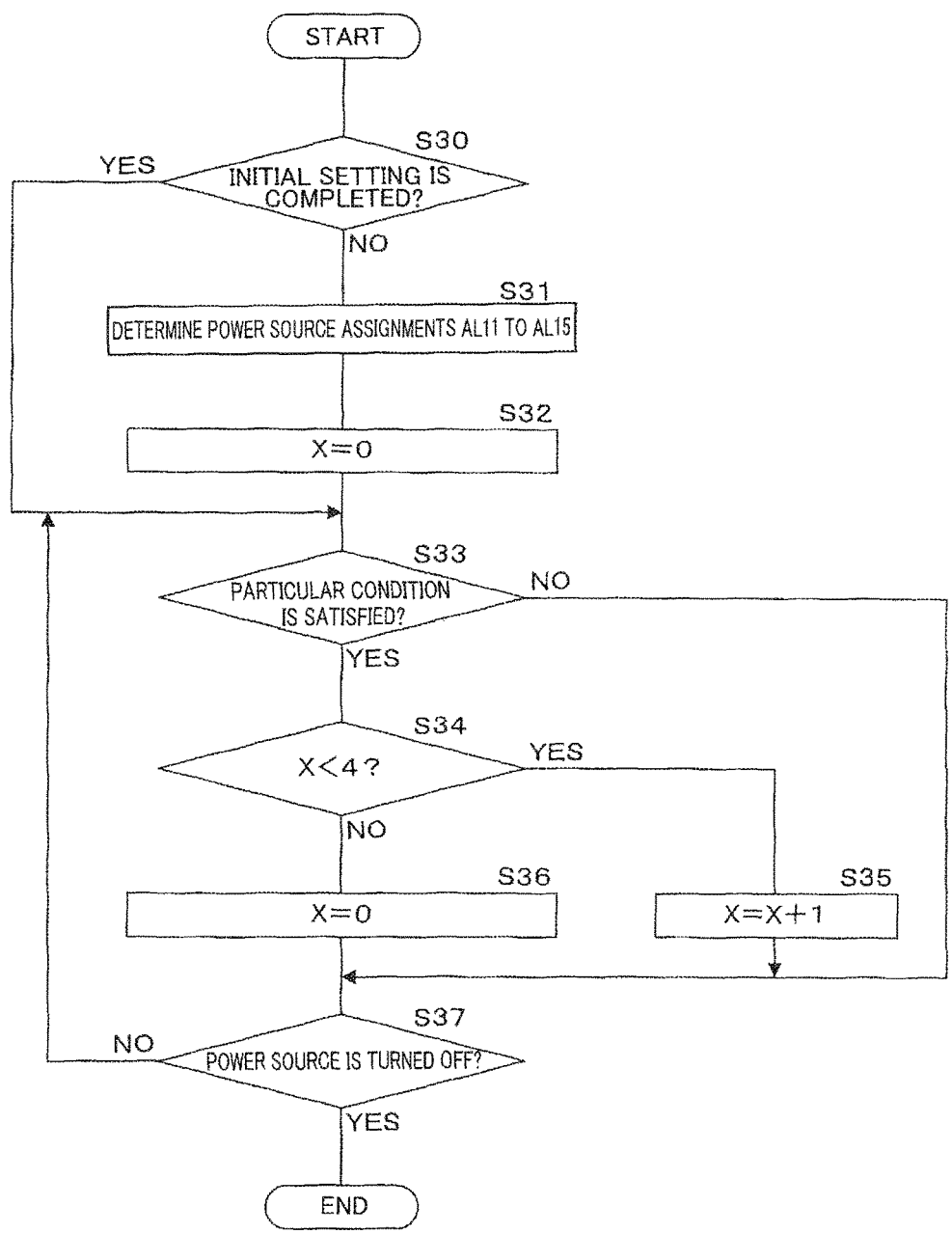
FIG. 10 is a flowchart illustrating a second example of the procedure of processing executed by the FPGA.

FIG. 10 is a flowchart illustrating a second example of the procedure of processing executed by the FPGA 51 in the present embodiment. It is noted that the processing illustrated in FIG. 10 corresponds to the operations in FIG. 9. This procedure begins with S30 at which the FPGA 51 determines whether the initial setting is completed. When the initial setting is not completed (S30: NO), the FPGA 51 at S31 determines the power source assignments AL11-AL15 and at S32 sets the variable X to zero. Also at the processing at S31 in the second example, the FPGA 51 may determine the power source assignments AL11-AL15 according to a predetermined rule stored in the non-volatile memory 52 in advance. In this determination, the FPGA 51 determines the power source assignments AL11-AL15 such that combinations in the power source assignments AL11-AL15 are different from each other. For example, the rule may be defined as follows: the power source assignment AL11 is simply determined such that the smallest number identifying the rank is assigned to the smallest number identifying the power supply circuit, and a larger number identifying the rank is assigned to a larger number identifying the power supply circuit in order, and the other power source assignments AL12-AL15 are determined randomly so as to be different from the power source assignment AL11 in combination. The FPGA 51 determines the power source assignments AL11-AL15 and stores, into the non-volatile memory 52, the power-source assignment information ALD11-ALD15 indicating the respective power source assignments AL11-AL15. When the initial setting is completed (S30: YES), this procedure goes to S33.

The FPGA 51 at S33 determines whether the particular condition is satisfied. When the particular condition is not satisfied (S33: NO), this procedure goes to S37. When the particular condition is satisfied (S33: YES), the FPGA 51 at S34 determines whether the value of the variable X is less than four.

When the variable X is less than four, that is, when the value of the variable X is one of 1 to 3 (S34: YES), the FPGA 51 at S35 increments the variable X by one and at S37 determines whether the power source is turned off by the user. When the power source is turned off (S37: YES), this procedure ends. When the variable X is not less than four, that is, when the value of the variable X is four (S34: NO), the FPGA 51 at S36 sets the value of the variable X to zero and stores the variable X into the non-volatile memory 52, and this procedure goes to S37. When the power source is not turned off (S37: NO), this procedure goes to S33.

The processing from S30 to S32 may be executed in the initial setting as described above.

While the FPGA 51 determines the power source assignments AL11-AL15 in the initial setting in the second example, the present disclosure is not limited to this configuration. For example, the printing apparatus 1 may be configured such that the non-volatile memory 52 in advance stores the power-source assignment information ALD11-ALD15 corresponding to the respective power source assignments AL11-AL15, and the FPGA 51 reads the power-source assignment information ALD11-ALD15 from the non-volatile memory 52 in printing and drives the driving elements 111 according to the assignment AL corresponding to the variable X. In this case, the processing at S30-S32 in the initial setting in FIG. 10 may be omitted.

FIG. 11 is for explaining a third example of the operations of the head unit 11 in the present embodiment. In FIG. 11, the power source numbers 1-5 respectively correspond to the first to fifth power supply circuits 21-25. The number of nozzles constituting each of the ranks R1-R5 is identical to that of the example in FIG. 6. In the example in FIG. 11, consideration is given to not only the number of nozzles but also the number of ejections from the nozzles.

In a state in which the ranks R1-R5 correspond to the respective power source numbers 1-5 according to a power source assignment AL21 (as one example of the first combination), the FPGA 51 calculates the total number (a total value of the number) of ejections from the nozzles (the total number of drivings of the driving elements) for each of the ranks R1-R5 over a particular period, e.g., a period of the single ON state of the power source and a period of a single print job. In the example in FIG. 11, the total number of ejections from the 100 nozzles constituting the rank R1 is 5000, the total number of ejections from the 300 nozzles constituting the rank R2 is 600, the total number of ejections from the 600 nozzles constituting the rank R3 is 3000, the total number of ejections from the 500 nozzles constituting the rank R4 is 200, and the total number of ejections from the 180 nozzles constituting the rank R5 is 1000.

The FPGA 51 creates second combination information ALD22 (as one example of the power-source assignment information) indicating a power source assignment AL22 (as one example of the second combination) based on the total number of ejections calculated for each of the ranks R1-R5.

After the particular condition is satisfied, the FPGA 51 controls the N number of the selectors 90(1)-90(n) in the driver IC 27 such that the N number of the driving elements 111 are connected to the M number of the power supply circuits 21-25 according to the power source assignment AL22, where N is 1680 and M is five, for example.

In the example in FIG. 11, in the power source assignment AL21, the rank R1 (as one example of the first driving element group) corresponds to the power source number 1 (as one example of the first power supply circuit), and the rank R4 (as one example of the second driving element group) corresponds to the power source number 4 (as one example of the second power supply circuit). In the power source assignment AL22 established after the particular condition is satisfied, the rank R1 (as one example of the first driving element group) corresponds to the power source number 4 (as one example of the second power supply circuit), and the rank R4 (as one example of the second driving element group) corresponds to the power source number 1 (as one example of the first power supply circuit).

In the power source assignment AL21, the rank R3 (as one example of the first driving element group) corresponds to the power source number 3 (as one example of the first power supply circuit), and the rank R2 (as one example of the second driving element group) corresponds to the power source number 2 (as one example of the second power supply circuit). In the power source assignment AL22 established after the particular condition is satisfied, the rank R3 (as one example of the first driving element group) corresponds to the power source number 2 (as one example of the second power supply circuit), and the rank R2 (as one example of the second driving element group) corresponds to the power source number 3 (as one example of the first power supply circuit).

Thus, the FPGA 51 switches the power supply circuits corresponding to the ranks, it is possible to prevent the total number of drivings of the power supply circuit (the number of ejections) from being extremely large in a specific power supply circuit, making it possible to substantially equalize respective loads on all the power supply circuits and prolong the lives of the power supply circuits.

The total number of ejections from the nozzles constituting the rank R3 is 3000 that is greater than 600 as the total number of ejections from the nozzles constituting the rank R2. Switching the power supply circuits corresponding to the ranks can replace a power supply circuit with a large number of drivings, with a power supply circuit with a small number of drivings, making it possible to substantially equalize loads on the respective power supply circuits.

In the example in FIG. 11, the rank R1 (as one example of the first driving element group) is the largest in the total number of ejections (5000 times) among the ranks R1-R5. This configuration substantially equalizes loads on the respective power supply circuits by reducing a load on the power supply circuit on which the highest load is imposed.

In the example in FIG. 11, the rank R4 (as one example of the second driving element group) is the smallest in the total number of ejections (200 times) among the ranks R1-R5. This configuration substantially equalizes loads on the respective power supply circuits by increasing a load on the power supply circuit on which the lowest load is imposed.

Figure 12:
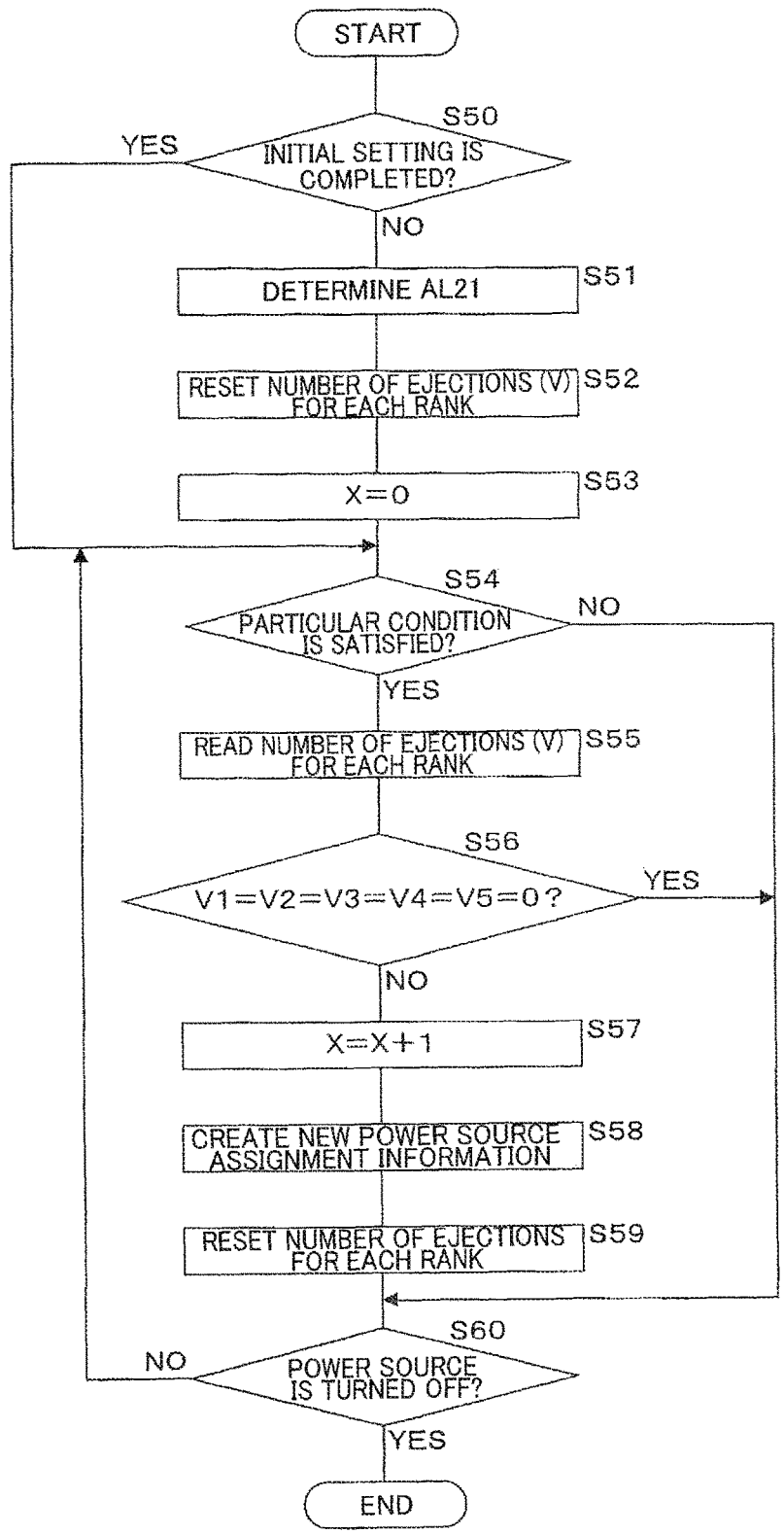
FIG. 12 is a flowchart illustrating a third example of the procedure of processing executed by the FPGA.

FIG. 12 is a flowchart illustrating a third example of the procedure of processing executed by the FPGA 51 in the present embodiment. It is noted that, the processing illustrating FIG. 12 corresponds to the operations in FIG. 11. When the power source of the printing apparatus 1 is turned on, the FPGA 51 at S50 determines whether the initial setting is completed. This determination is executed by determining whether the power-source assignment information ALD21 is stored in the non-volatile memory 52.

When the initial setting is completed (S50: YES), this procedure goes to S54. When the initial setting is not completed (S50: NO), the FPGA 51 at S51 determines the power source assignment AL21. In the third example, as with the first example, the smallest number identifying the rank is assigned to the smallest number identifying the power supply circuit, and a larger number identifying the rank is assigned to a larger number identifying the power supply circuit in order.

The FPGA 51 at S52 resets the number of ejections (V) of the nozzles corresponding to each rank and stores the number of ejections (V) into the non-volatile memory 52. In this reset, for example, the FPGA 51 sets the number of ejections (V) to zero (V1=V2=V3=V4=V5=0).

The FPGA 51 at S53 also sets the variable X to zero and stores the variable X into the non-volatile memory 52. The FPGA 51 at S54 determines whether the particular condition is satisfied. When the particular condition is not satisfied (S54: NO), this procedure goes to S60.

When the particular condition is satisfied (S54: YES), the FPGA 51 at S55 reads, from the non-volatile memory 52, the number of ejections (V) of the nozzles corresponding to each rank and the power-source assignment information ALD corresponding to the value of the variable X at this time point. It is noted that the number of ejections of the nozzles corresponding to each rank has been updated in the case where printing in printing processing described below is executed after the number of ejections of the nozzles corresponding to each rank is set to zero at S52 as described above. In the case where the particular condition is satisfied for the first time at S54 after the initial setting, the value of the variable X is set to zero. In this case, the FPGA 51 reads the power-source assignment information ALD21 corresponding to the state in which the value of the variable X is zero. In the case where the particular condition is satisfied for the second time after the initial setting, the FPGA 51 reads the power-source assignment information ALD22 corresponding to the state in which the value of the variable X is one.

At S56, the FPGA 51 determines whether each of the numbers of ejections V1, V2, V3, V4, V5 is equal to zero (V1=V2=V3=V4=V5=0). When each of the numbers of ejections V1, V2, V3, V4, V5 is equal to zero (S56: YES), this procedure goes to S60.

When one or more of the numbers of ejections V1, V2, V3, V4, V5 are not equal to zero (S56: NO), the FPGA 51 at S57 increments the value of the variable X by one and stores the updated value of the variable X into the non-volatile memory 52.

The FPGA 51 creates a new assignment based on the number of ejections for each of the ranks which is read at S55 and based on the power-source assignment information ALD (e.g., the power-source assignment information ALD21) and stores, into the non-volatile memory 52, the power-source assignment information ALD (e.g., the power-source assignment information ALD22) indicating the created new assignment.

Specifically, the FPGA 51 first specifies a rank with the largest number of ejections among the numbers read at S55 (e.g., the rank R1), a rank with the smallest number of ejections among the numbers read at S55 (e.g., the rank R4), a rank with the second largest number of ejections among the numbers read at S55 (e.g., the rank R3), and a rank with the second smallest number of ejections among the numbers read at S55 (e.g., the rank R2). The power supply circuit (e.g., the power supply circuit 21) assigned to the rank with the largest number of ejections (e.g., the rank R1) in the power source assignment AL (e.g., AL21) indicated by the power-source assignment information ALD read at S55 is then assigned to the rank with the smallest number of ejections (e.g., the rank R4) in the new assignment (e.g., AL22). Also, the power supply circuit (e.g., the power supply circuit 23) assigned to the rank with the second largest number of ejections (e.g., the rank R3) according to the power source assignment AL (e.g., AL21) indicated by the power-source assignment information ALD read at S55 is assigned to the rank with the second smallest number of ejections (e.g., the rank R2) in the new assignment (e.g., AL22). Also, the power supply circuit (e.g., the power supply circuit 24) assigned to the rank with the smallest number of ejections (e.g., the rank R4) in the power source assignment AL (e.g., AL21) indicated by the power-source assignment information ALD read at S55 is assigned to the rank with the largest number of ejections (e.g., the rank R1) in the new assignment (e.g., AL22). Also, the power supply circuit (e.g., the power supply circuit 22) assigned to the rank with the second smallest number of ejections (e.g., the rank R2) in the power source assignment AL (e.g., AL21) indicated by the power-source assignment information ALD read at S55 is assigned to the rank with the second largest number of ejections (e.g., the rank R3) in the new assignment (e.g., AL22). In the present embodiment, the FPGA 51 does not change the assignment of the power source for the rank with the third largest number of ejections (e.g., the rank R5).

Thus, the FPGA 51 creates new assignment by replacing the assignment of the power source for the rank with the largest number of ejections, with the assignment of the power source for the rank with the smallest number of ejections and replacing the assignment of the power source for the rank with the second largest number of ejections, with the assignment of the power source for the rank with the second smallest number of ejections, and the FPGA 51 stores new assignment information ALD (e.g., the power-source assignment information ALD22) indicating the created new assignment, into the non-volatile memory 52, as assignment information corresponding to the value (e.g., one) of the variable X updated at S57.

The FPGA 51 at S59 resets the number of ejections for each rank to zero and at S60 determines whether the power source is turned off. When the power source is not turned off (S60: NO), this procedure returns to S54. When the power source is turned off (S60: YES), this procedure ends.

According to the present embodiment, each time when the particular condition is satisfied, the FPGA 51 sets the value of the new variable X, creates new assignment information corresponding to the value, and stores the created new assignment information into the non-volatile memory 52.

Figure 13:
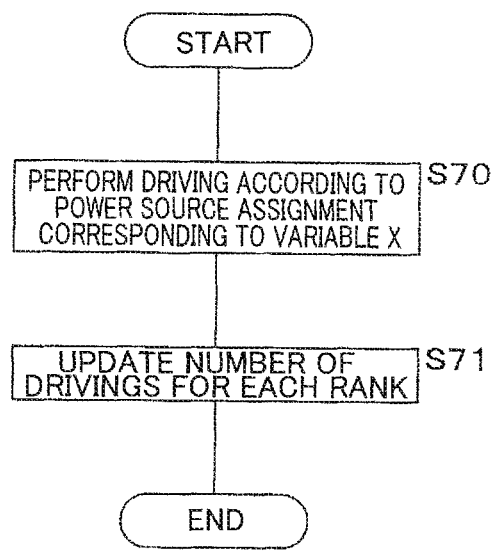
FIG. 13 is a flowchart illustrating a third example of the procedure of the printing processing executed by the FPGA.

FIG. 13 is a flowchart illustrating a third example of the procedure of the printing processing executed by the FPGA 51 in the present embodiment. FIG. 13 illustrates processing executed by the FPGA 51 after the printing apparatus 1 receives an instruction of printing from the user in the case where the power source of the printing apparatus 1 is ON.

As illustrated in FIG. 13, after the printing apparatus 1 receives the printing instruction, the FPGA 51 at S70 drives the driving elements 111 according to the power source assignment AL corresponding to the value indicated by the variable X stored in the processing in FIG. 12 and executes printing. In the present embodiment, in the case where the variable X is zero, the FPGA 51 drives the driving elements 111 according to the power source assignment AL21 based on the power-source assignment information ALD21 stored in the non-volatile memory 52. In the case where the variable X is one, the FPGA 51 drives the driving elements 111 according to the power source assignment AL22 based on the power-source assignment information ALD22 stored in the non-volatile memory 52.

When the printing is ended, the FPGA 51 at S71 calculates the total number of drivings of the driving element 111 in the current printing for each rank and adds the calculated number to the number of drivings stored in the non-volatile memory 52 to update the number of drivings for each rank which is stored in the non-volatile memory 52.

In the third example described above, the counted number of ejections for each rank is accumulated without reset even after the power source assignment is changed, but the present disclosure is not limited to this configuration. For example, processing for setting each of the numbers of ejections V1, V2, V3, V4, V5 to zero may be added between S59 and S60 in FIG. 12 to reset the number of ejections for each rank. This configuration enables replacement of the power source corresponding to the rank with a large number of ejections in a period starting from the time when the power source assignment is changed most recently to the time when the power source assignment is changed next time by satisfaction of the particular condition, with the power source corresponding to the rank with a small number of ejections in the period.

Figure 14:
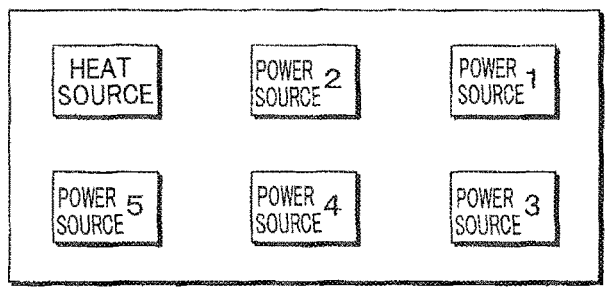
FIG. 14 is a diagram for explaining a fourth example of the operations of the head unit.

FIG. 14 is for explaining a fourth example of the operations of the head unit 11 in the present embodiment. In FIG. 14, the power source numbers 1-5 respectively correspond to the first to fifth power supply circuits 21-25. The number of nozzles constituting each of the ranks R1-R5 is identical to that of the example in FIG. 6. In this example, power sources 1 to 5 (corresponding to the respective first to fifth power supply circuits 21-25) and a heat source (e.g., a VCOM power source) are arranged as illustrated in FIG. 14.

In the first example described above, the power-source assignment information ALD1 is simply created at S11 in FIG. 7 such that the smallest number identifying the rank is assigned to the smallest number identifying the power supply circuit, and a larger number identifying the rank is assigned to a larger number identifying the power supply circuit in order. In this fourth example, the assignment information is created according to a rule described below.

The FPGA 51 acquires number information (e.g., the nozzle addresses) from the non-volatile memory 62 of the flexible circuit board 60. The number information is for specifying the number of nozzles (driving elements) constituting each of the ranks R1-R5. In the example in FIG. 14, as in the example in FIG. 6, the ranks R1-R5 are respectively constituted by 100 nozzles, 300 nozzles, 600 nozzles, 500 nozzles, and 180 nozzles.

The FPGA 51 creates information indicating the power source assignment AL1 (as one example of first combination information indicating the first combination), based on the number of nozzles constituting each of the ranks R1-R5.

The FPGA 51 controls the N number of the selectors 90(1)-90(n) in the driver IC 27 until the particular condition is satisfied, such that the N number of the driving elements 111 are connected to the M number of the power supply circuits according to the power source assignment AL1 where N is 1680, and M is five, for example.

As illustrated in FIG. 14, the power source 1 is the closest to the power source 3 among the power sources 1, 2, 4, 5, and the power source 4 (or may be the power source 2) is the second closest to the power source 3 among the power sources 1, 2, 4, 5. The FPGA 51 associates the rank R3 with the power source number 3, the rank R1 with the power source number 1, and the rank R2 with the power source number 4 in the power source assignment AL1.

That is, the power source 1 (as one example of the second power supply circuit) is the closest to the power source 3 (as one example of the first power supply circuit), and the power source 4 (as one example of a third power supply circuit) is the second closest to the power source 3 (as one example of the first power supply circuit) among the M number of the power supply circuits other than the power supply circuits 23 corresponding to the power source 3. The number (100) of nozzles (the driving elements 111) constituting the rank R1 corresponding to the power source 1 is less than the number (600) of nozzles (the driving elements 111) constituting the rank R3 corresponding to the power source 3 and less than the number (300) of nozzles (the driving elements 111) constituting the rank R2 corresponding to the power source 4.

According to the configuration described above, even in the case where the power sources 3 and 4 configured to drive the driving elements 111 greater in number than the driving elements 111 driven by the power source 1 are arranged around the power source 1, the number of the driving elements 111 driven by the power source 1 is less than that of the driving elements 111 driven by each of the power sources 3 and 4 arranged around the power source 1. Thus, the power source 1 is rarely affected by heat from the devices around the power source 1. This prevents reduction in the life of the power supply circuit due to thermal stress.

Figure 15:
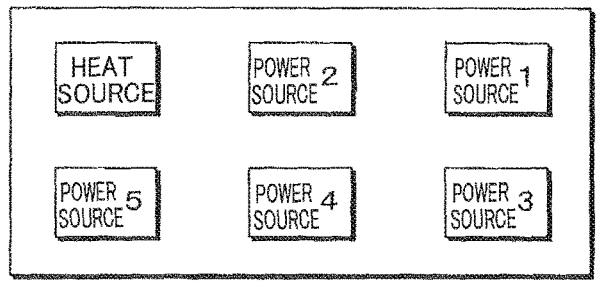
FIG. 15 is a diagram for explaining a fifth example of the operations of the head unit.

FIG. 15 is for explaining a fifth example of the operations of the head unit 11 in the present embodiment. In FIG. 15, the power source numbers 1-5 respectively correspond to the first to fifth power supply circuits 21-25. The number of nozzles constituting each of the ranks R1-R5 is identical to that of the example in FIG. 6. The arrangement of the power sources 1 to 5 (corresponding to the respective first to fifth power supply circuits 21-25) and the heat source is identical to that in the example in FIG. 14.

In the fifth example, the assignment information may be created by setting the power source assignment AL1 in the initial setting in a manner described below. As illustrated in FIG. 15, in the power source assignment AL1 since a large amount of heat is transferred from the heat source to the power source 2 and the power source 5, the FPGA 51 associates the power source 2 with the rank R1 (constituted by 100 nozzles) and associates the power source 5 with the rank R5 (constituted by 180 nozzles). Since a small amount of heat is transferred from the heat source to the power source 1, the FPGA 51 associates the power source 1 with the rank R3 (constituted by 600 nozzles).

This configuration reduces variations in amounts of heat transferred from the heat source to the power supply circuits, thereby preventing the heat from greatly affecting only a specific power supply circuit. This makes it possible to equalize thermal stresses imposed on the respective power supply circuits and prolong the lives of the respective power supply circuits equally.

As described above, according to the present embodiment, it is possible to evenly use the M number of the power supply circuits driving N driving elements 111, it is possible to suppress variations in the life of each of the power supply circuits, and it is possible to prolong the life of all of the power supply circuits.

In the initial setting of the power source assignment, as described above, the FPGA 51 may simply execute the assignment, as in the first example, such that the smallest number identifying the rank is assigned to the smallest number identifying the power supply circuit, and a larger number identifying the rank is assigned to a larger number identifying the power supply circuit in order, and may execute the assignment based on a relationship in arrangement among the heat source and the power sources as in the fourth or fifth example. In this case, the FPGA 51 need not create the power-source assignment information and at least needs to in advance store, into the non-volatile memory 52, assignment information created in advance based on information about the number of nozzles for each rank and drive the driving element 111 based on the stored assignment information.

The above-described power source assignment in the fourth or fifth example or the fifth example is not limited to one used for the initial setting in the rotation of the power sources (i.e., change in assignment of the power sources). For example, the FPGA 51 may determine power source assignment based on the power source assignment in the fourth or fifth example and not change the power source assignment after the power source assignment is determined once. This configuration also reduces increase in temperature of a specific power supply circuit and prolongs the life of the power supply circuit.

Electronic components such as electrolytic capacitors are used for the power supply circuit for driving the driving elements, the lives of such electronic components may be increased and reduced according to a load current (a ripple current), heat, or the like. This affects the length of the life of the liquid-droplet ejecting apparatus.

To solve this problem, a method is considered in which auxiliary electrolytic capacitors are provided in advance, and in the case where the lives of the electrolytic capacitors in use have expired, the electrolytic capacitors in use are switched to the auxiliary electrolytic capacitors to substantially prolong the lives of the electrolytic capacitors. In the case where a plurality of power supply circuits are provided, however, the auxiliary electrolytic capacitors need to be provided for the respective power supply circuits, which may lead increase in size of the liquid-droplet ejecting apparatus, unfortunately. Also, load states of the power supply circuits are not uniform depending upon usage conditions of the nozzles. Thus, for example, there are electrolytic capacitors each approaching the end of its life and electrolytic capacitors each having enough life, so that some auxiliary electrolytic capacitors are useless in the power supply circuit.

According to the present embodiment, when the particular condition is satisfied, the ranks are switched to change the number of nozzles for each of the first to fifth power supply circuits 21-25 which supplies the driving signal to the nozzles. This makes it possible to: prevent the life of a specific power supply circuit from decreasing due to increase in load current on the specific power supply circuit; substantially equalize load currents respectively on all the power supply circuits; and prolong the lives of the power supply circuits.

While each of the driving elements 111 is the piezoelectric element including the first activation portion and the second activation portion for one pressure chamber in the present embodiment, the present disclosure is not limited to this configuration. For example, the present disclosure may be applied to all types of liquid-droplet ejecting apparatuses including: a liquid-droplet ejecting apparatus including a piezoelectric element having only one activation portion for one pressure chamber; and a thermal ink-jet liquid-droplet ejecting apparatus including a heater as a driving element to eject liquid by an air bubble generated by the heater.

While the wires of the control lines 33(1)-33(n) are connected to the driver IC 27 in the present embodiment, but the present disclosure is not limited to this configuration. For example, the printing apparatus 1 may be configured such that signal to be transmitted through the control lines 33(1)-33(n) are converted to serial signals in the FPGA 51, then the converted serial signals are output to the driver IC 27 via one or a small number of serial signal lines, then the serial signals are converted to parallel signals in the driver IC 27, and then the converted signals are output to the n number of the selectors or the n number of the waveform generating circuits. This configuration reduces the number of wires and the number of pins necessary for the IC, for example.

In the present embodiment, the flexible circuit board 60 and the second circuit board 50 are detachably connected to each other by a connector, and a head module including the flexible circuit board 60, the driving elements 111, and the nozzles are separable from the second circuit board 50.

The rule for determining the power source assignment AL, or the power-source assignment information ALD created in advance is stored into the non-volatile memory 52 in the present embodiment but may be stored into the EEPROM 712 of the first circuit board 71.

What is claimed is:
1. A liquid-droplet ejecting apparatus, comprising:
an N number of nozzles, N being a natural number greater than or equal to 2;
an N number of driving elements provided respectively corresponding to the N number of nozzles;
an M number of power supply circuits each configured to create a driving signal to be selectively supplied to a corresponding one of the N number of driving elements, M being a natural number greater than or equal to 2 and less than N;
an N number of selecting circuits disposed between the N number of driving elements and the M number of power supply circuits and configured to selectively connect one of the M number of power supply circuits to a corresponding one of the N number of driving elements; and a controller, wherein the controller is configured to perform:

controlling the N number of selecting circuits such that each of the M number of power supply circuits is connected to one or more of the N number of driving elements in a first combination until a particular condition is satisfied, the first combination being a combination between an M number of driving element groups and the M number of power supply circuits respectively corresponding to the M number of driving element groups, the N number of driving elements being divided into the M number of driving element groups based on a voltage of the supplied driving signal; and controlling the N number of selecting circuits such that each of the M number of power supply circuits is connected to the N number of driving elements in a second combination after the particular condition is satisfied, the second combination being a combination between the M number of driving element groups and the M number of power supply circuits respectively corresponding to the M number of driving element groups, the second combination being different from the first combination.

2. The liquid-droplet ejecting apparatus according to claim 1, wherein the M number of driving element groups comprise a first driving element group and a second driving element group, wherein the M number of power supply circuits comprise: a first power supply circuit corresponding to the first driving element group in the first combination; and a second power supply circuit corresponding to the second driving element group in the first combination, and wherein, in the second combination, a power supply circuit corresponding to the first driving element group is the second power supply circuit, and a power supply circuit corresponding to the second driving element group is the first power supply circuit.

3. The liquid-droplet ejecting apparatus according to claim 2, wherein the number of driving elements in the first driving element group is greater than the number of driving elements in the second driving element group.

4. The liquid-droplet ejecting apparatus according to claim 3, wherein the number of driving elements in the first driving element group is the largest among the M number of driving element groups.

5. The liquid-droplet ejecting apparatus according to claim 4, wherein the number of driving elements in the second driving element group is the smallest among the M number of driving element groups.

6. The liquid-droplet ejecting apparatus according to claim 2, wherein the controller is configured to calculate a total number of drivings of the driving elements for each of the M number of driving element groups in a state in which the N number of driving elements are connected to the M number of power supply circuits in the first combination, wherein the controller is configured to: create second combination information indicating the second combination based on an M number of total numbers, each as the total number, which are calculated respectively for the M number of driving element groups; and control the N number of selecting circuits such that the N number of driving elements are connected to the M number of power supply circuits in the second combination indicated by the second combination information after the particular condition is satisfied, and the total number of drivings in the first driving element group is greater than the total number of drivings in the second driving element group.

7. The liquid-droplet ejecting apparatus according to claim 6, wherein the total number of drivings in the first driving element group is the largest among the M number of driving element groups.

8. The liquid-droplet ejecting apparatus according to claim 7, wherein the total number of drivings in the second driving element group is the smallest among the M number of driving element groups.

9. The liquid-droplet ejecting apparatus according to claim 2, wherein the controller is configured to:
acquire number information for specifying the number of driving elements in each of the M number of driving element groups,
create first combination information indicating the first combination based on the number information, and
control the N number of selecting circuits such that the N number of driving elements are connected to the M number of power supply circuits in the first combination indicated by the first combination information until the particular condition is satisfied, wherein the number of driving elements in the first driving element group is greater than the number of driving elements in the second driving element group, and wherein the first power supply circuit is disposed at a position at which an amount of heat transferred from a heat source disposed in the liquid-droplet ejecting apparatus is less than an amount of heat transferred from the heat source to a position at which the second power supply circuit is disposed.

10. The liquid-droplet ejecting apparatus according to claim 2, wherein the controller is configured to:
acquire number information for specifying the number of driving elements in each of the M number of driving element groups;
create first combination information indicating the first combination based on the number information; and
control the N number of selecting circuits such that the N number of driving elements are connected to the M number of power supply circuits in the first combination indicated by the first combination information until the particular condition is satisfied, wherein the M number of driving element groups comprise the first driving element group, the second driving element group, and a third driving element group, wherein the M number of power supply circuits comprise: the first power supply circuit corresponding to the first driving element group in the first combination; the second power supply circuit corresponding to the second driving element group in the first combination; and a third power supply circuit corresponding to the third driving element group in the first combination, wherein the second power supply circuit is disposed at a position which is the closest to the first power supply circuit among the M number of power supply circuits, wherein the third power supply circuit is disposed at a position which is the second closest to the first power supply circuit among the M number of power supply circuits, wherein the number of driving elements in the second driving element group is less than the number of driving elements in the first driving element group, and wherein the number of driving elements in the second driving element group is less than the number of driving elements in the third driving element group.

11. The liquid-droplet ejecting apparatus according to claim 1, wherein the particular condition is satisfied when a power source is turned on.

12. The liquid-droplet ejecting apparatus according to claim 1, wherein the particular condition is satisfied when a particular length of time is elapsed from a time when the particular condition is last satisfied.

* * * * *